(12) United States Patent
Van De Water et al.

(10) Patent No.: US 10,651,007 B2
(45) Date of Patent: May 12, 2020

(54) CRYOGENIC CELL FOR MOUNTING A SPECIMEN IN A CHARGED PARTICLE MICROSCOPE

(71) Applicant: FEI Company, Hillsboro, OR (US)

(72) Inventors: Gerbert Jeroen Van De Water, Breugel (NL); Roland W. P Jonkers, Someren (NL); Gijs Van Duinen, Utrecht (NL); Stephanus H. L. Van Den Boom, Geldrop (NL); Fotios Sakellariou, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/166,242

(22) Filed: Oct. 22, 2018

(65) Prior Publication Data
US 2019/0131105 A1 May 2, 2019

(30) Foreign Application Priority Data

Oct. 26, 2017 (EP) ..................................... 17198436

(51) Int. Cl.
*H01J 37/20* (2006.01)
*H01J 37/26* (2006.01)

(52) U.S. Cl.
CPC .............. *H01J 37/20* (2013.01); *H01J 37/26* (2013.01); *H01J 2237/2001* (2013.01); *H01J 2237/2002* (2013.01)

(58) Field of Classification Search
CPC ................................ H01J 37/26; H01J 37/261

USPC .......................................... 250/306, 307, 311
See application file for complete search history.

(56) References Cited

U.S. PATENT DOCUMENTS

| | | | | |
|---|---|---|---|---|
| 3,171,957 A | * | 3/1965 | Coleman | H01J 37/20 250/443.1 |
| 4,179,605 A | * | 12/1979 | Watanabe | H01J 37/20 250/311 |
| 4,591,722 A | | 5/1986 | Biddlecombe et al. | |
| 2005/0103997 A1 | * | 5/2005 | Muller | H01J 37/20 250/311 |
| 2007/0252090 A1 | | 11/2007 | Van De Water et al. | |

FOREIGN PATENT DOCUMENTS

JP  2000260378  9/2000

* cited by examiner

*Primary Examiner* — Jason L McCormack

(57) ABSTRACT

A method of examining a cryogenic specimen in a Charged Particle Microscope, comprising:
 Providing the specimen in a cryogenic cell on a specimen holder;
 Directing a charged particle beam from a source and along an axis through an evacuated beam conduit of an illuminator system so as to irradiate at least a portion of the specimen therewith;
 Using a detector to detect radiation emanating from the specimen in response to said irradiation,
further comprising:
 Configuring said cell to comprise an elongate tube that extends within said beam conduit into said illuminator system and encloses said axis;
 Maintaining said tube at a cryogenic temperature at least during said irradiation.

7 Claims, 3 Drawing Sheets

CRYOGENIC CELL FOR MOUNTING A SPECIMEN IN A CHARGED PARTICLE MICROSCOPE

The techniques disclosed herein relate to methods of examining a cryogenic specimen in a Charged Particle Microscope, comprising:
  Providing the specimen in a cryogenic cell on a specimen holder;
  Directing a charged particle beam from a source and along an axis through an evacuated beam conduit of an illuminator system so as to irradiate at least a portion of the specimen therewith;
  Using a detector to detect radiation emanating from the specimen in response to said irradiation.
The disclosed techniques also relate to a charged particle microscope in which such a method can be enacted.

The term "cryogenic" should be interpreted as referring to temperatures at or below −150° C. Typical examples of cryogenic fluids ("cryogens") include liquid nitrogen, liquid helium, liquid ethane, liquid propane, liquid oxygen, and mixtures hereof. A cryogenic cell ("cryo box") as referred to here is a cell (container/capsule/box) in which a specimen can be held at cryogenic temperature, and in which:
  A first aperture allows access of the irradiating beam to the specimen;
  A (discretionary) second aperture allows radiation emanating from the specimen to reach said detector.
The cell will typically be comprised of material with good thermal conductivity (e.g. comprising suitable metal) that is thermally connected to a vat of cryogen, for example.

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" apparatus (e.g. a FIB-SEM), which additionally employ a "machining" Focused Ion Beam (FIB), allowing supportive activities such as ion-beam milling or Ion-Beam-Induced Deposition (IBID), for example. More specifically:
  In a SEM, irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons), for example; one or more components of this emanating radiation is/are then detected and used for image accumulation purposes.
  In a TEM, the electron beam used to irradiate the specimen is chosen to be of a high-enough energy to penetrate the specimen (which, to this end, will generally be thinner than in the case of a SEM specimen); the transmitted electrons emanating from the specimen can then be used to create an image. When such a TEM is operated in scanning mode (thus becoming a STEM), the image in question will be accumulated during a scanning motion of the irradiating electron beam.
As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions, protons and positrons, for instance.

It should be noted that, in addition to imaging and performing (localized) surface modification (e.g. milling, etching, deposition, etc.), a charged particle microscope may also have other functionalities, such as performing spectroscopy, examining diffractograms, etc.

In all cases, a Charged Particle Microscope (CPM) will comprise at least the following components:
  A particle source, such as a Schottky electron source or ion source.
  An illuminator system (charged particle beam column), which serves to manipulate a "raw" radiation beam from the source and perform upon it certain operations such as focusing, aberration mitigation, cropping (with a diaphragm), filtering, etc. It will generally comprise one or more (charged-particle) lenses, and may comprise other types of (particle-)optical component also. If desired, the illuminator can be provided with a deflector system that can be invoked to cause its exit beam to perform a scanning motion across the specimen being investigated.
  A specimen holder, on which a specimen under investigation can be held and positioned (e.g. tilted, rotated). If desired, this holder can be moved so as to effect scanning motion of the specimen with respect to the beam. In general, such a specimen holder will be connected to a positioning system. When intended to hold cryogenic specimens, the specimen holder can be provided with a cryogenic cell as alluded to above; this cell may be configured to be demountable when not required.
  A detector (for detecting radiation emanating from an irradiated specimen), which may be unitary or compound/distributed in nature, and which can take many different forms, depending on the radiation being detected. Examples include photodiodes, CMOS detectors, CCD detectors, photovoltaic cells, X-ray detectors (such as Silicon Drift Detectors and Si(Li) detectors), etc. In general, a CPM may comprise several different types of detector, selections of which can be invoked in different situations.
In the case of a transmission-type microscope (such as a (S)TEM, for example), a CPM will additionally comprise:
  An imaging system, which essentially takes charged particles that are transmitted through a specimen (plane) and directs (focuses) them onto analysis apparatus, such as a detection/imaging device, spectroscopic apparatus (such as an EELS device: EELS=Electron Energy-Loss Spectroscopy), etc. As with the illuminator system referred to above, the imaging system may also perform other functions, such as aberration mitigation, cropping, filtering, etc., and it will generally comprise one or more charged-particle lenses and/or other types of particle-optical components.
In what follows, the disclosed techniques may—by way of example—sometimes be set forth in the specific context of electron microscopy; however, such simplification is intended solely for clarity/illustrative purposes, and should not be interpreted as limiting.

An example of a cryogenic specimen is a vitrified biological sample, for instance, in which water content has been congealed into an amorphous solid form that is different from conventional, crystalline water ice. Such vitrification can occur using, for example, a rapid cooling/plunge cooling technique as set forth in U.S. Pat. No. 9,116,091, US 2016/0245732 A1 and US 2017/0169991 A1 (all assigned to the assignee of the present application, and incorporated herein by reference for all purposes). Non-biological examples include, for instance, cooled ceramic/metal/semiconductor materials for superconductivity studies, cooled metals (or other construction materials) for low-temperature brittleness studies, etc.

When studying a cryogenic specimen in a CPM, the usable lifetime of the specimen is currently limited by the deposition rate of environmental water-ice contamination on the specimen, due to the inevitable presence of unwanted water molecules in the CPM's vacuum chamber. In many cases, a specimen will be unusable after a time period of the order of just a day. Since many specimens are rare and/or expensive and/or have been subjected to time-consuming and costly preparation processes (such as TEM specimen lift-out and milling in a FIB-SEM), such rapid deterioration due to water-ice contamination is very frustrating.

It is an object of the disclosure to address such issues. More specifically, it is an object of the disclosure to at least provide a modified architecture/method for cryogenic specimen study in a CPM that can lead to a significant increase in usable lifetime of the specimen in the CPM.

These and other objects are achieved in a method as set forth in the opening paragraph above, characterized by:
  Configuring said cell to comprise an elongate tube that extends within said beam conduit and encloses said axis;
  Maintaining said tube at a cryogenic temperature at least during said irradiation.

As already mentioned above, gaseous water in the CPM's vacuum chamber is responsible for water-ice contamination on a cryogenic specimen. When the specimen is shielded in a cryogenic cell, water in the vacuum of the beam conduit is the main contributor to such contamination. The elongate tube (snout) of the as disclosed herein has a two-pronged effect on such contamination, in that:
  It alters/reduces the acceptance angles (into the cryogenic cell) of water molecules emanating from relatively warm inner surfaces of the beam conduit, whereby one should realize that such surfaces reflect water molecules flying in straight lines due to the relatively large mean free path (of the order of meters) in typical CPM vacuum conditions.
  Water molecules that do manage to enter the tube will, if travelling at an angle to the beam axis, have a good chance of hitting the inner wall of the tube, since the elongate form of the tube makes a wall collision likely before such a molecule can enter the cryogenic cell. Since the tube is maintained at a cryogenic temperature, such a colliding water molecule will freeze into position upon contact with the tube wall, thus preventing it from continuing its journey toward the cell.

To give a non-limiting example: assuming a cryogenic cell with a height (along the beam axis) of ca. 10 mm, and using an elongate tube—according to the present disclosure—with a height of ca. 60-100 mm and a diameter of ca. 1 mm (internal)/2 mm (external), the inventors have observed a reduction in water ice contamination of a specimen within the cryogenic cell by a factor of five—which represents a huge extension of usable specimen lifetime.

A further effect of the elongate tube of the present invention is that it tends to increase the stiffness of the cryogenic cell assembly, thus giving it a higher eigenfrequency. As a result, it tends to suffer less from vibration effects, and associated electrical eddy currents.

In an embodiment, the elongate tube is configured to be demountable from the cryogenic cell. Such a construction is advantageous in that it makes it easier to place/remove the cryogenic cell within the cramped specimen space below (and within) the illuminator system. One way of achieving such a demountable structure is to provide an extremity of the tube and a receptive portion of the cryogenic cell with cooperating screw threads, thereby allowing the tube to be screwed onto/off of the cell at will. In an alternative approach, the tube is thermally clamped into a cooperating cavity in the cell, by virtue of a difference in thermal coefficient of expansion between said extremity/cavity; in such a structure, the tube and cavity can be easily separated at room temperature, but become tightly clamped together when cooled, for example. Complementary material pairs for this latter embodiment include, for example, aluminum/titanium.

An elongate tube as disclosed herein can, for example, be manufactured by conventional machining techniques, such as drilling a longitudinal bore along the cylindrical axis of a solid metallic cylinder, for example. Alternatively, one could fold/roll a metal sheet in upon itself, so as to transform it into a cylindrical form, for instance. Yet another alternative would be to cast the tube using an annular-cylindrical mold into which liquid metal is poured. The skilled artisan will be able to select a manufacturing technique that is suited to the needs of a given situation.

The invention will now be elucidated in more detail on the basis of exemplary embodiments and the accompanying schematic drawings, in which:

FIG. 1 renders a longitudinal cross-sectional elevation view of an embodiment of a CPM in which the present invention can be implemented.

FIG. 2A renders a magnified view of part of the subject of FIG. 1, more specifically a vicinity of the specimen/cryogenic cell.

In the Figures, where pertinent, corresponding parts are indicated using corresponding reference symbols.

Embodiment 1

Figure 1:
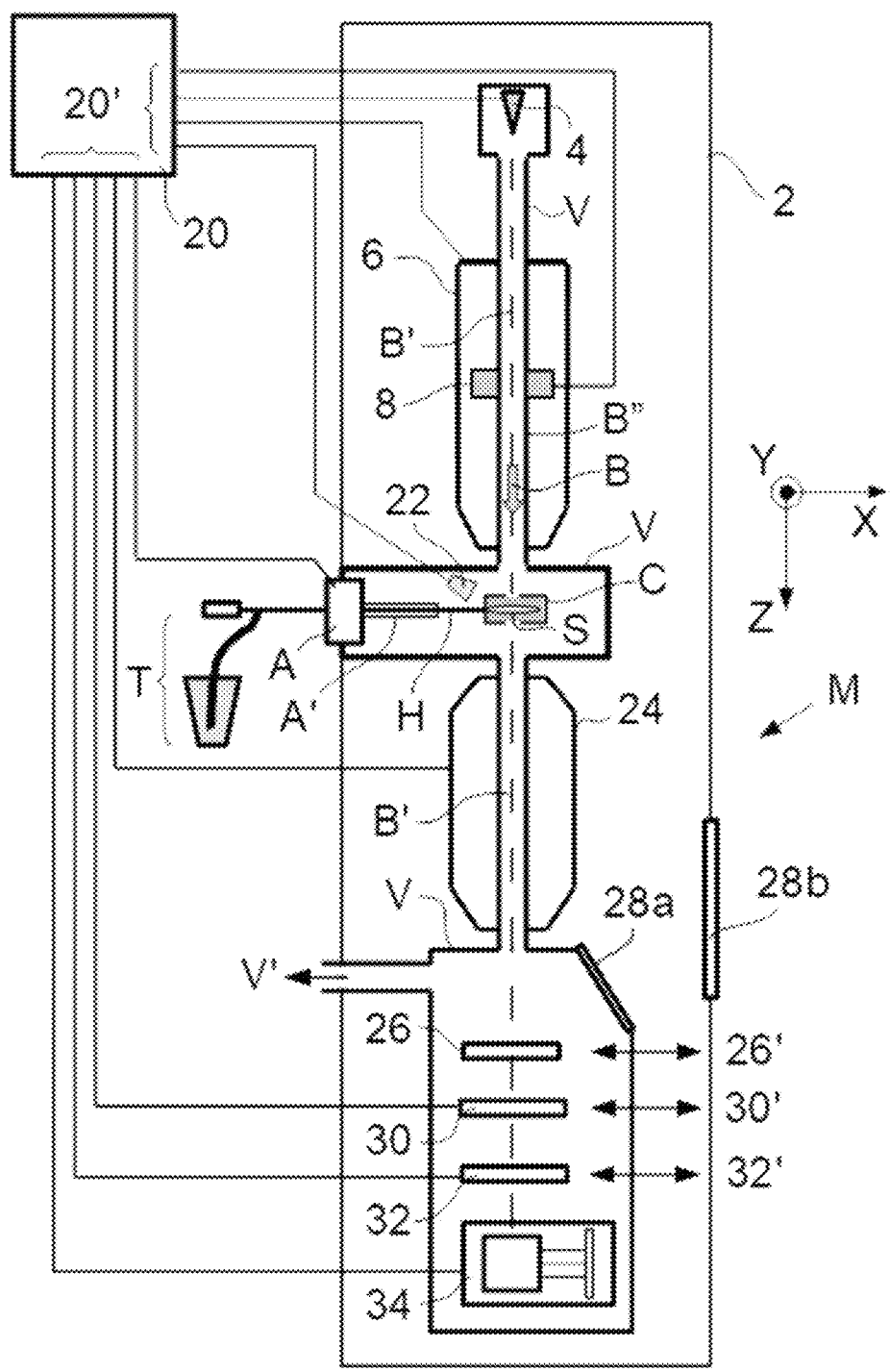

FIG. 1 (not to scale) is a highly schematic depiction of an embodiment of a CPM M in which the present invention is implemented; more specifically, it shows an embodiment of a TEM/STEM (though, in the context of the current invention, it could just as validly be an ion-based microscope or a SEM, for example). In the Figure, within a general cabinet/cover 2, there is a vacuum enclosure V, which can be evacuated by a schematically depicted vacuum pump assembly V'. Within this vacuum enclosure V, an electron source 4 produces a beam B of electrons that propagates along an electron-optical axis B' and traverses an illuminator system (charged particle beam column) 6, serving to direct/focus the electrons onto a chosen part of a specimen S (which will generally be (locally) thinned/planarized). Also depicted is a deflector 8, which (inter alia) can be used to effect scanning motion of the beam B. Where possible, the vacuum enclosure V will generally "hug" the axis B', taking the form of a relatively narrow beam conduit B" (e.g. of the order of ca. 0.5 cm in diameter) through the illuminator 6, but widening out where necessary to accommodate certain structures (such as the items H, 26, 30, 32, and 34 discussed below, for example).

The specimen S is held on a specimen holder H that can be positioned in multiple degrees of freedom by a positioning device/stage A, which moves a cradle A' into which holder H is (removably) affixed; for example, the specimen holder H may comprise a finger that can be moved (inter alia) in the XY plane (see the depicted Cartesian coordinate system), with motion parallel to Z and tilt about X/Y also typically being possible. Such movement allows different parts of the specimen S to be illuminated/imaged/inspected by the electron beam B traveling along axis B' (in the Z direction), and/or allows scanning motion to be performed as an alternative to beam scanning. When the specimen S is a cryogenic specimen, then:

- The specimen holder H can be maintained at a cryogenic temperature using a (schematically depicted) temperature control assembly T. This may, for example, comprise a conductive (e.g. metallic) wick that is thermally connected to the holder H and is immersed in a bath of cryogen, or a pipe system carrying a circulating cryogen, for example.
- The specimen holder H can be provided with a (cooled) cryogenic cell C, in which the specimen S is seated, with beam entry/exit apertures disposed along axis B'.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be nominally detected with the aid of analysis device 22 (when the cryogenic cell is not deployed), which might be a combined scintillator/photomultiplier or EDX (Energy-Dispersive X-Ray Spectroscopy) module, for instance; in such a case, an image could be constructed using basically the same principle as in a SEM. However, alternatively or supplementally, one can study electrons that traverse (pass through) the specimen S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image or diffractogram of (part of) the specimen S will be formed by imaging system 24 on screen 26, and this may be viewed through viewing ports 28a, 28b located in suitable parts of the walls of enclosure V/cabinet 2. The retraction mechanism for screen 26 may, for example, be mechanical and/or electrical in nature, and is not depicted here.

As an alternative to viewing an image/diffractogram on screen 26, one can instead make use of the fact that the depth of focus of the electron flux leaving imaging system 24 is generally quite large (e.g. of the order of 1 meter). Consequently, various other types of analysis apparatus can be used downstream of screen 26, such as:

- TEM camera 30. At camera 30, the electron flux can form a static image or diffractogram that can be processed by controller/processor 20 and displayed on a display device (not depicted), such as a flat panel display, for example. When not required, camera 30 can be retracted/withdrawn (as schematically indicated by arrows 30') so as to get it out of the way of axis B'.
- STEM camera 32. An output from camera 32 can be recorded as a function of (X,Y) scanning position of the beam B on the specimen S, and an image can be constructed that is a "map" of output from camera 32 as a function of X,Y. Camera 32 can comprise a single pixel with a diameter of e.g. 20 mm, as opposed to the matrix of pixels characteristically present in camera 30. Moreover, camera 32 will generally have a much higher acquisition rate (e.g. $10^6$ points per second) than camera 30 (e.g. $10^2$ images per second). Once again, when not required, camera 32 can be retracted/withdrawn (as schematically indicated by arrows 32') so as to get it out of the way of axis B' (although such retraction would not be a necessity in the case of a donut-shaped annular dark field camera 32, for example; in such a camera, a central hole would allow flux passage when the camera was not in use).
- As an alternative to imaging using cameras 30 or 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

Note that controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). Needless to say, the (schematically depicted) controller 20 may be (partially) inside or outside the cabinet 2, and may have a unitary or composite structure, as desired.

The skilled artisan will understand that the interior of the enclosure V does not have to be kept at a strict vacuum; for example, in a so-called "Environmental TEM/STEM", a background atmosphere of a given gas is deliberately introduced/maintained within the enclosure V.

Figure 2A:
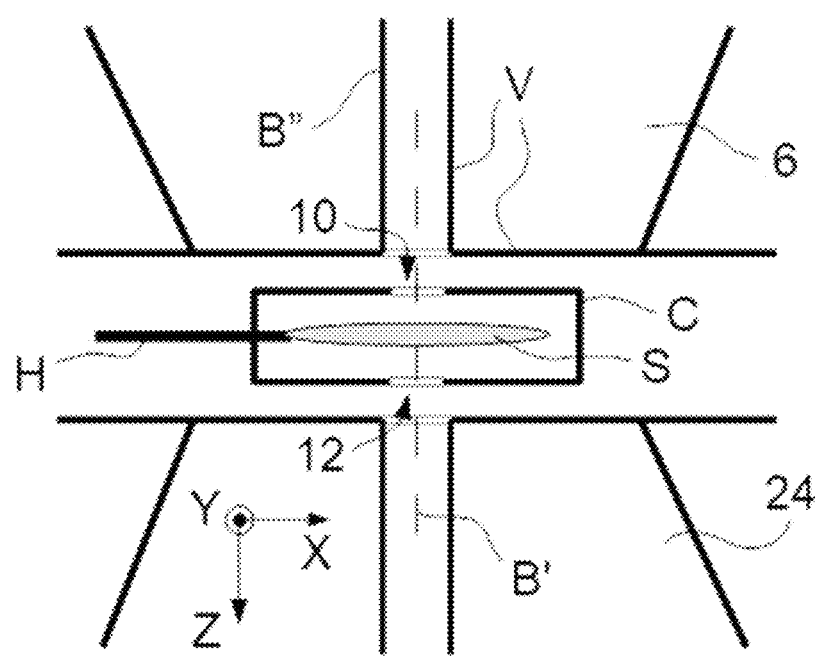
FIG. 2B shows how the subject of FIG. 2A is modified according to an embodiment of the present invention.
FIG. 2C shows the subject of FIG. 2B, in which comparative acceptance angles/opening angles have been illustrated.

Turning now to FIG. 2A, this shows a magnified view of the vicinity of the cryogenic cell C of FIG. 1. This cryogenic cell C is essentially a box with thermally conducting (e.g. metallic) walls that are maintained at cryogenic temperatures, e.g. by virtue of intimate thermal contact with cooled specimen holder H and/or as a result of a dedicated flow of cryogen through a cooling tube in intimate contact with said walls. The cryogenic cell C may, for example, take the form of a pillbox/squat cylinder, e.g. with a diameter (in the XY plane) of ca. 30 mm and a height parallel to Z (and B') of ca. 9 mm. It includes:

- A first beam access (entry) aperture 10, to allow beam B to impinge upon specimen S;
- A second beam access (exit) aperture 12, to allow beam B to continue into imaging system 24 after traversing specimen S.

To this end, both apertures 10, 12 are disposed (e.g. centered) upon beam axis B', and can have a diameter of ca. 1 mm, for example.

Figure 2B:
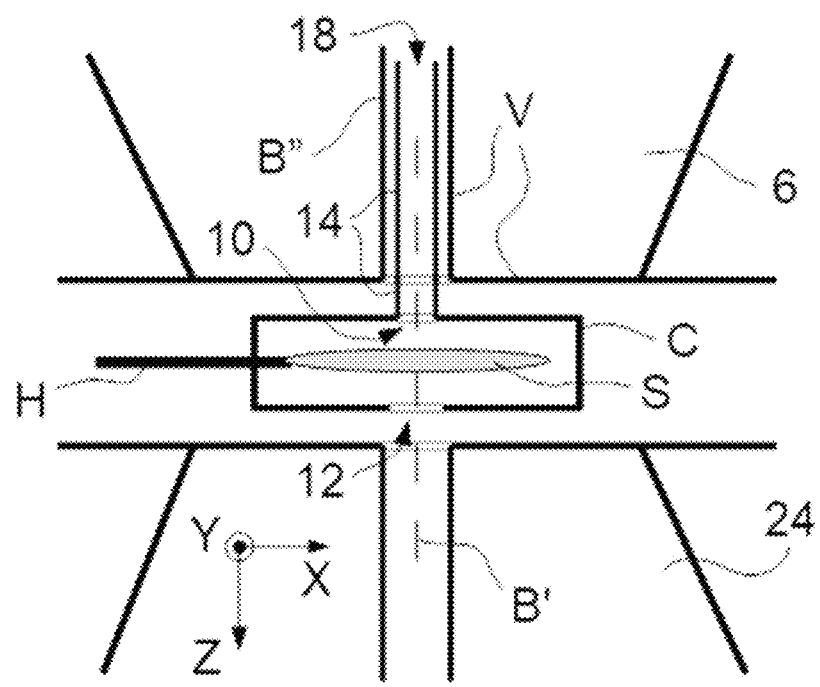

In FIG. 2B, the set-up of FIG. 2A has been modified in accordance with (an embodiment of) the present disclosure. To this end, an elongate tube (snout) 14 now extends from the upper (beam entry) side of the cryogenic cell C and protrudes into beam conduit B", thereby reaching upward into illuminator system 6. This tube 14 encloses (embraces) beam axis B', and effectively displaces beam entry aperture 10 up into the illuminator 6, creating a new entry aperture 18 at an elevated location relative to the old aperture 10. The elongate tube 14 has thermally conducting (e.g. metallic) walls that connect intimately to the cryogenic cell C, as a result of which the tube 14 is also cooled to cryogenic temperatures. By way of example, the tube 14 can have a height (parallel to Z) of ca. 60 mm, and an internal diameter (in the XY plane) of ca. 1 mm—though other values are, of course, possible. As set forth above, the tube 14 may, if desired, be demountable/detachable from the cryogenic cell C; alternatively, it can be permanently attached to the cell C, e.g. using a solder joint, or adhesive connection, for instance.

Figure 2C:
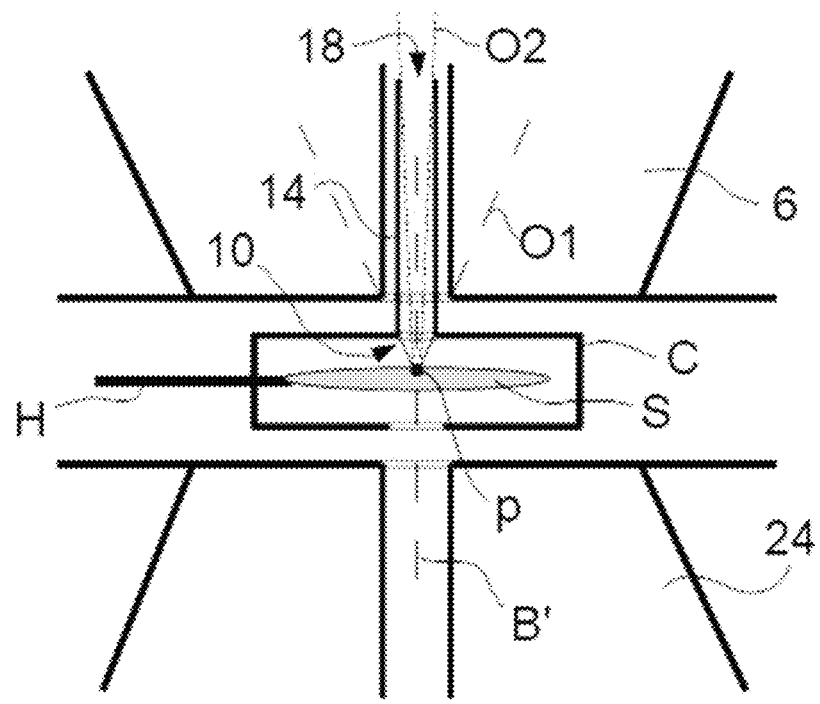

Turning now to FIG. 2C, this schematically illustrates an effect of the disclosure as applied in FIG. 2B relative to the prior-art situation of FIG. 2A. The coarse broken line O1 delimits an acceptance angle of aperture 10 relative to an intersection point p of beam axis B' with specimen S; essentially, this line O1 skims the edges of aperture 10, and defines the surface of an associated acceptance cone. Similarly, the fine broken line O2 delimits an acceptance angle of aperture 18 relative to said point p, and defines the surface of an associated acceptance cone. It is immediately evident that the (conical) acceptable angle/opening angle associated with line O2 (present invention) is much smaller than that associated with line O1 (prior art). As a result, fewer water molecules bouncing from the inner walls of beam conduit B" can now impinge upon the specimen S—they are much more likely to impact upon an inner surface of the elongate tube 14, where they will congeal because of the fact that the tube 14 is cooled (thereby acting as a cold trap).

The invention claimed is:

1. A method of examining a cryogenic specimen in a Charged Particle Microscope, comprising:
   directing a charged particle beam from a source and along an axis through an evacuated beam conduit of an illuminator system so as to irradiate at least a portion of the specimen therewith;
   using a detector to detect radiation emanating from the specimen in response to said irradiation;
   providing the specimen in a cryogenic cell on a specimen holder;
   configuring said cell to comprise an elongate tube that extends within said beam conduit into said illuminator system, wherein said elongate tube encloses said axis; and
   maintaining said tube at a cryogenic temperature at least during said irradiation.

2. A method according to claim 1, wherein said elongate tube is configured to be demountable from said cell.

3. A method according to claim 2, wherein an extremity of said tube is thermally clamped into a cooperating cavity in said cell, by virtue of a difference in thermal coefficient of expansion between said extremity and said cavity.

4. A method according to claim 1, wherein:
   said specimen holder is maintained at a cryogenic temperature using a temperature control assembly;
   said cryogenic cell is maintained at a cryogenic temperature by virtue of intimate thermal contact said specimen holder;
   said elongate tube has thermally conducting walls that connect intimately to said cryogenic cell, as a result of which the tube is cooled to a cryogenic temperature.

5. A method according to claim 1, wherein said elongate tube is employed as a cold trap to capture and congeal water molecules that impact with its inner walls.

6. A Charged Particle Microscope comprising:
   a charged particle source, for producing a charged particle beam;
   an illuminator system, for directing the beam along an axis through an evacuable beam conduit so as to irradiate at least a portion of the specimen with said beam;
   a detector, for detecting radiation emanating from the specimen in response to said irradiation; and
   a specimen holder, for holding a cryogenic cell in which a specimen can be provided, wherein said cell comprises an elongate tube that extends within said beam conduit into said illuminator system, wherein said elongate tube encloses said axis and said elongate tube is connectable to a cooling device for maintaining it at a cryogenic temperature at least during said irradiation.

7. The charged particle microscope of claim 6, wherein said elongate tube extends from a beam entry side of the cryogenic cell and towards said charged particle source.

* * * * *